(12) United States Patent
Uekawa

(10) Patent No.: US 8,896,079 B2
(45) Date of Patent: Nov. 25, 2014

(54) CAMERA MODULE HAVING A LIGHT SHIELDABLE LAYER

(71) Applicant: LAPIS Semiconductor Co., Ltd., Yokohama (JP)

(72) Inventor: Masahiro Uekawa, Kanagawa (JP)

(73) Assignee: LAPIS Semiconductor Co., Ltd., Yokohama (JP)

(*) Notice: Subject to any disclaimer, the term of this patent is extended or adjusted under 35 U.S.C. 154(b) by 0 days.

(21) Appl. No.: 14/135,676

(22) Filed: Dec. 20, 2013

(65) Prior Publication Data

US 2014/0110807 A1    Apr. 24, 2014

Related U.S. Application Data

(62) Division of application No. 12/591,131, filed on Nov. 10, 2009, now Pat. No. 8,637,949.

(30) Foreign Application Priority Data

Nov. 11, 2008    (JP) .................... 2008-288882

(51) Int. Cl.
  *H01L 27/00*      (2006.01)
  *H01L 31/0216*    (2014.01)
  *H01L 27/146*     (2006.01)
  *H04N 5/225*      (2006.01)

(52) U.S. Cl.
  CPC .... *H01L 31/02164* (2013.01); *H01L 27/14618* (2013.01); *H01L 27/14625* (2013.01); *H01L 27/14687* (2013.01); *H04N 5/2257* (2013.01)
  USPC ......................................... 257/432

(58) Field of Classification Search
  CPC .................. H01L 31/0232; H01L 27/14625; H01L 27/14687; H01L 31/02164
  USPC .................................... 257/432–436
  See application file for complete search history.

(56) References Cited

U.S. PATENT DOCUMENTS

| 7,872,278 | B2  |  1/2011 | Stoyan |
| 7,875,944 | B2  |  1/2011 | Higashi et al. |
| 7,880,127 | B2  |  2/2011 | Garris |
| 7,928,545 | B2  |  4/2011 | Kwon et al. |
| 8,269,300 | B2* |  9/2012 | Chien et al. ................... 257/434 |
| 8,338,904 | B2* | 12/2012 | Tanida et al. ................. 257/460 |
| 8,440,488 | B2* |  5/2013 | Tu et al. ........................ 438/55 |
| 8,541,820 | B2* |  9/2013 | Hayasaki et al. ............. 257/225 |
| 8,546,739 | B2* | 10/2013 | Hsuan et al. ................. 250/216 |
| 8,563,350 | B2* | 10/2013 | Tu et al. ........................ 438/66 |

(Continued)

FOREIGN PATENT DOCUMENTS

| JP | 2004-363380 A   | 12/2004 |
| JP | 2005-056998     |  3/2005 |
| JP | 2005-539276     | 12/2005 |
| WO | WO 2006/109638 A1 | 10/2006 |

*Primary Examiner* — Nathan Ha
(74) *Attorney, Agent, or Firm* — Rabin & Berdo, P.C.

(57) ABSTRACT

A camera module has a sensor chip including a sensor unit formed on a main surface around which sides are disposed. A lens chip is fixed to the sensor chip with a spacer unit and includes a lens unit corresponding to the sensor unit. A light shieldable layer covers a first side of the sensor chip and a side of the spacer unit. A first cutting surface includes a second side of the sensor chip and a side of the light shieldable layer on a same plane.

11 Claims, 12 Drawing Sheets

(56) References Cited

U.S. PATENT DOCUMENTS

| | | | |
|---|---|---|---|
| 8,581,313 B2* | 11/2013 | Katsuno et al. | 257/292 |
| 8,581,386 B2* | 11/2013 | Yen et al. | 257/698 |
| 8,692,344 B2* | 4/2014 | Oganesian | 257/431 |
| 8,709,878 B2* | 4/2014 | Bolken et al. | 438/127 |
| 2006/0202293 A1* | 9/2006 | Bogdan et al. | 257/432 |
| 2008/0211045 A1* | 9/2008 | Ono | 257/432 |
| 2009/0134483 A1* | 5/2009 | Weng et al. | 257/432 |

* cited by examiner

CAMERA MODULE HAVING A LIGHT SHIELDABLE LAYER

This is a Divisional of U.S. application Ser. No. 12/591,131, filed on Nov. 10, 2009, and allowed on Sep. 20, 2013, the subject matter of which is incorporated herein by reference.

BACKGROUND OF THE INVENTION

1. Field of the Invention

The present invention relates to a camera module, and, more particularly, to a camera module having a light shielding film that can be manufactured at a wafer level.

2. Description of the Related Art

To comply with demands for low costs and size reduction, conventional camera modules are constructed in a chip size package (CSP) type structure. A wafer level CSP camera device (Patent document 1: Japanese Patent Application Publication No. 2005-539276) and a structure in which a semiconductor chip having a circuit unit including a light receiving element and a coating layer formed on the semiconductor chip are provided, and an encapsulation resin is formed over the entirety of the semiconductor chip and at the side of the coating layer (Patent document 2: Japanese Patent Application Publication No. 2004-363380) are known.

Whereas, in the conventional camera modules, even though a sensor substrate and a lens substrate are mounted at a wafer level, it is necessary to form a light shielding cover on the chip of each of the camera modules after the camera modules are individually divided by dicing. The light shielding cover is formed only after the dicing, with the result that there is no light shielding method at a wafer level, and the number of processes for the chip of each of the camera modules is increased. Therefore, there has been a demand in the industry for a structure in which the number of processes can be reduced.

For example, the Patent document 2 discloses an overall thick semiconductor device in which an external terminal at the reverse side surface of the semiconductor chip is formed in the shape of a high column, an encapsulation film is formed to cover the side of the reverse side surface of the semiconductor device, the encapsulation film is ground, and a bump electrode is formed on the external terminal. In this conventional art, however, a process of drawing a bump electrode out from the columnar external terminal is added, and, furthermore, a manufacturing process, such as a lens unit mounting process, is increased.

SUMMARY OF THE INVENTION

Therefore, the present invention has been made in view of the above problems, and it is an object of the present invention to provide a camera module and a manufacturing method of the same that is capable of reducing the number of manufacturing processes, thereby improving a yield ratio of the camera module.

In accordance with an aspect of the present invention, the above and other objects can be accomplished by the provision of a manufacturing method of a camera module, including the steps of:

forming a wafer assembly of a semiconductor wafer and a light transmissible optical wafer which are fixed to each other, wherein the semiconductor wafer has an array of plural sensor units each having a light receiving unit of a photoelectric conversion element, and wherein the light transmissible optical wafer has an array of plural lens units, the lens units being opposite to the respective sensor units while each pair of the lens unit and the sensor unit faces each other across a space, so that the semiconductor wafer and the light transmissible optical wafer are adhered at circumferences of the respective pair of the lens unit and the sensor unit with a spacer unit, cutting the wafer assembly at she spacer unit to individually divide the wafer assembly into a plurality of camera modules each comprising a sensor chip and a lens chip bonded to each other by a spacer, forming a light shieldable mask film to determine a lens aperture of each of the plural lens units on the light transmissible optical wafer;

forming a groove in the light transmissible optical wafer of the wafer assembly such that the groove reaches the spacer unit and filling the groove with a light shieldable resin to form a light shieldable resin layer; and cutting the light shieldable resin layer at a width less than the groove to individually divide the camera modules in each of which the light shieldable resin layer is provided at a side of the lens chip.

In accordance with another aspect of the present invention, there is provided a camera module including a sensor chip having a sensor unit comprising a light receiving unit of a photoelectric conversion element and a lens chip having a lens unit fixed to the sensor chip at a circumference of the sensor unit with a spacer, the lens unit being opposite to the sensor unit while a space is provided between the lens unit and the sensor unit, wherein the camera modules has a light shieldable mask film to determine a lens aperture of the lens unit formed on the lens chip and a light shieldable resin layer forming a common outer flat surface together with at least parts of sides of the lens chip and the spacer unit.

According to the camera module manufacturing method of the present invention, it is possible to form the groove in the dicing region (the spacer unit) and to fill the interior of the groove with the light shieldable resin, thereby reducing costs. According to the present invention, therefore, the resin layer is formed over the entirety of the semiconductor chip after the groove is formed in the dicing region, thereby greatly reducing the number of processes as compared with the technology of Patent document 2 in which the post forming process is added to draw the electrode out from the resin layer.

Also, according to the present invention, the semiconductor wafer is not cut, but only the light transmissible optical wafer is cut, during forming of the groove. As compared with the technology of Patent document 2, therefore, it is possible to increase an effective number of camera modules obtained from a sheet of semiconductor wafer, thereby improving a yield ratio.

In the semiconductor device manufacturing method according to the present invention, it is possible to form the light shieldable resin layer such that the outer side surface of the light shieldable resin layer is parallel to the side surface of the lens chip and the side surface of the semiconductor chip such that the groove divides the spacer units. That is, in the structure of this embodiment, the light shieldable resin layer is fixed only to the side surface of the lens chip and the spacer unit between the light transmissible optical wafer and the semiconductor wafer, with the result that it is possible to maintain reliability, such as damp proofness, and, in addition, to save the material for she light shieldable resin layer. Furthermore, according to the present invention, in a case in which a silicon wafer shielding visible light is adopted as the spacer, it is not necessary to form the groove over the entirety of the spacer, thereby further saving the amount of the resin.

Also, since it is possible for the camera module manufacturing method to include a process of grinding the semiconductor wafer of the wafer assembly to reduce the thickness of the semiconductor wafer after forming the wafer assembly, the light transmissible optical wafer supports the semiconductor wafer, thereby retaining the strength, and the damage to the semiconductor wafer is effectively avoided during handling or transfer of the wafer assembly.

BRIEF DESCRIPTION OF THE DRAWINGS

The aforementioned aspects and other features of the invention are explained in the following description, taken in connection with the accompanying drawing figures wherein:

FIG. 11 is a schematic perspective view of the wafer assembly of the light transmissible optical wafer and the semiconductor wafer bonded to each other in a dicing device illustrating a groove forming process according to a first embodiment of the present invention;

FIGS. 12 to 20 are partial sectional views of a wafer assembly of a camera wafer and a semiconductor wafer bonded to each other illustrating a camera module manufacturing process according to a first embodiment of the present invention;

DETAILED DESCRIPTION OF THE INVENTION

Figure 1:
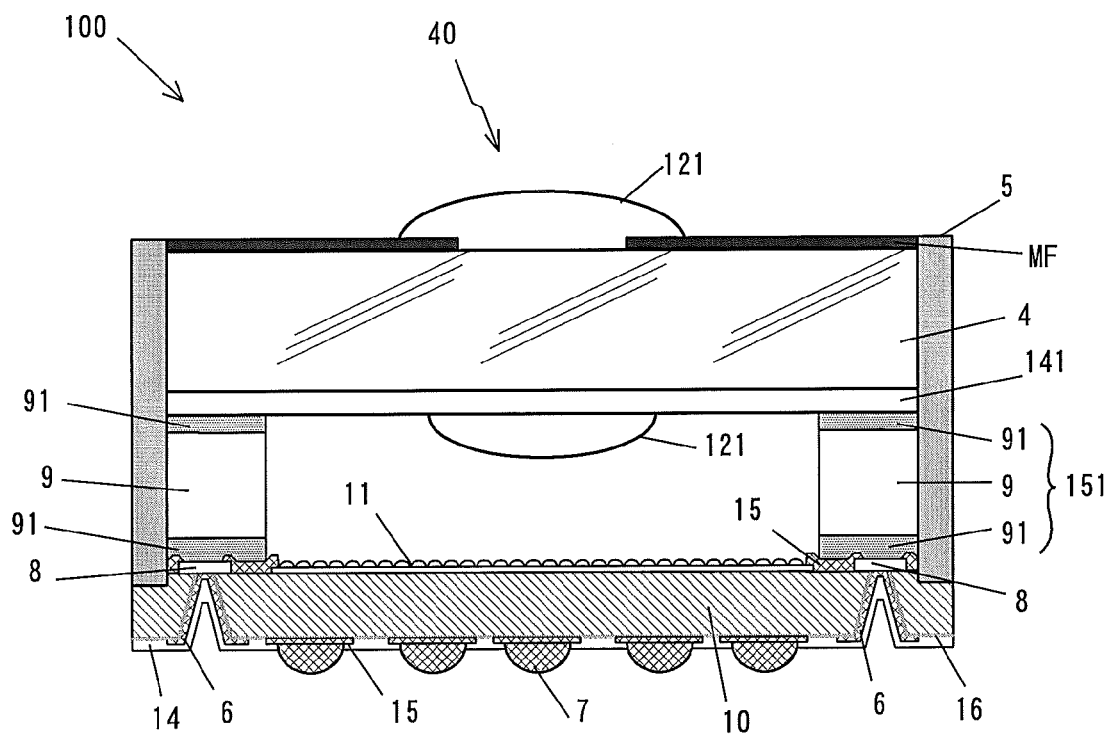
FIG. 1 is a sectional view illustrating a camera module according to a first embodiment of the present invention.

Now, exemplary embodiments of the present invention will be described in detail with reference to the accompanying drawings. In the drawings, the same elements are denoted by the same reference numerals even though they are depicted in different drawings, and a detailed description thereof will be omitted. Furthermore, it should be noted that these embodiments are only for illustrative purposes and the invention is not limited thereto.

FIG. 1 is a schematic sectional view illustrating a camera module according to a first embodiment of the present invention wherein a sensor chip 10 and a lens chip 40 are joined to each other with a spacer unit 151.

The camera module 100 includes the lens chip 40, which is a lens module, and the sensor chip 10 joined to the lens chip 40 with the spacer unit 151. The sensor chip 10 is a silicon substrate provided with a sensor unit including a light receiving unit, having photoelectric conversion elements, in which a via electrode 6 is provided. The lens chip 40 includes a glass plate 4, a light shieldable mask film MF, a lens unit 121, and an infrared (IR) cut filter. An individual cutting starting from a light transmissible optical wafer (hereinafter, referred to as a glass wafer) of the glass plate is performed to obtain the lens chip with the sensor chip. An infrared (IR) cut filter 141 prevents the occurrence of noise due to the incidence of infrared rays upon the light receiving unit 11 from outside.

In the lens chip 40, the IR cut filter 141 is formed on one side of a main surface (inner surface) of the glass plate 4, and the light shieldable mask film MF, which determines a lens aperture, is deposited on the reverse side of the main surface (outer surface) of the glass plate 4. The light shieldable mask film MF may be formed, for example, of a chrome film. The IR cut filter 141 is a dielectric multi-layered film formed by deposition. The IR cut filter 141 is constructed, for example, in a structure in which an inorganic material film exhibiting a high index of refraction and an inorganic material film exhibiting a low index of refraction are alternately stacked.

The lens unit 121, made of a light transmissible resin, is formed on the light shieldable mask film MF and on a portion of the glass plate 4 exposed through the opening of the light shieldable mask film MF. The light transmissible resin may be of an ultraviolet curable type or a heat curable type. Also, the lens unit 121 is formed at the outer surface of the glass plate 4. The lens unit 121 may also be formed at the inner surface of the glass plate 4.

The spacer unit 151 includes a spacer 9 made of glass having a predetermined thickness to prescribe a flange back for fixing a lens focus and adhesive material layers 91 disposed at opposite main surfaces of the spacer 9. An ultraviolet curable type or a heat curable type adhesive material may be used.

The light receiving unit 11, including, for example, light receiving elements, such as complementary metal oxide semiconductor (CMOS) sensors, is formed on a first main surface of the sensor chip 10 joined to the spacer unit 151. On-chip micro lenses respectively loaded on the photoelectric conversion elements may be mounted on the light receiving unit 11. On the first main surface of the sensor chip 10 at the circumference of the light receiving unit 11 are formed an inner wire 15, which is connected to the light receiving unit 11, and a metal pad 8. The inner wire 15 and the metal pad 8 constitute a sensor unit together with the light receiving unit 11.

Also, outer wires 15 and external terminals 7 are formed at predetermined positions of a second main surface (the reverse side surface) opposite to the first main surface of the sensor chip 10. An insulation film 14 is formed at the remaining region excluding the external terminals 7.

In the sensor chip 10, the via electrode 6 is provided below the metal pad 8 provided around the outer circumference of the first main surface of the sensor chip 10, and the via electrode 6 is electrically connected to the wires 15 of the first and second main surfaces. By the via electrode extending between the first and second main surfaces, electrical connection to the light receiving unit 11 is achieved by the outer wire 15 of the second main surface without drawing out a conductive body at the side of the sensor chip. Meanwhile, the via electrode 6 is electrically insulated from the material of the sensor chip 10 by an insulation film 16 previously formed on the entirety of the reverse side surface of the chip and on the inside of the via electrode 6.

The lens chip 40 is fixed to the first main surface of the sensor chip 10 with the spacer unit 151 at the circumference of the light receiving unit 11 such that a space is provided between the lens chip 40 and the light receiving unit 11. Since an individual cutting starting from the wafer is performed by dicing, the lens chip 40, the sensor chip 10, and the spacer unit 151 have flat sides. Consequently, a light shieldable resin layer 5 fixed to the side of the lens chip 40 has an outer side surface which is in the same plane as the side surface of the semiconductor chip also fixed to the spacer unit 151. When viewed from the front of the lens chip 40, therefore, the lens chip 40 is formed with an area less than that of the semiconductor chip 10. External light reaches the main surface of the semiconductor chip 10 through the outer main surface of the lens chip 40, and is converted into an electric signal by the light receiving unit 11. On the other hand, light incident upon the side surface of the lens chip 40 is shielded by the light shieldable resin layer 5. Since the light shieldable resin layer 5, which is colored black, is disposed at the side surface of the lens chip 40, it is possible to manufacture a camera module wherein penetration of light from the side surface of the lens chip is prevented.

As described above, it is possible to reduce the size of the lens chip 40 and restrain incidence of light upon the side surface of the lens chip 40 by forming the light shieldable resin layer 5 at the side surface of the lens chip 40. Furthermore, it is possible to prevent the occurrence of partial defects of the lens chip 40 by the light shieldable resin layer 5 in a manufacturing process and to improve reliability by the reduction in stress at the adhesion layer interfaces of the spacer unit 151.

A schematic process flow of a manufacturing method of a camera module according to a first embodiment of the present invention will be described with reference to the drawings.

Semiconductor Wafer Manufacturing Process

Figure 2:
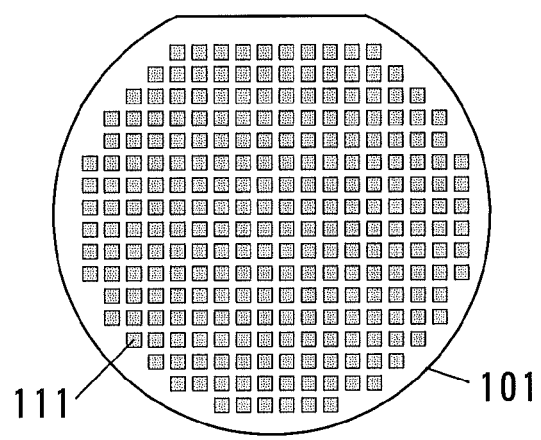
FIG. 2 is a schematic plan view illustrating a semiconductor wafer according to a first embodiment of the present invention.
Figure 3:
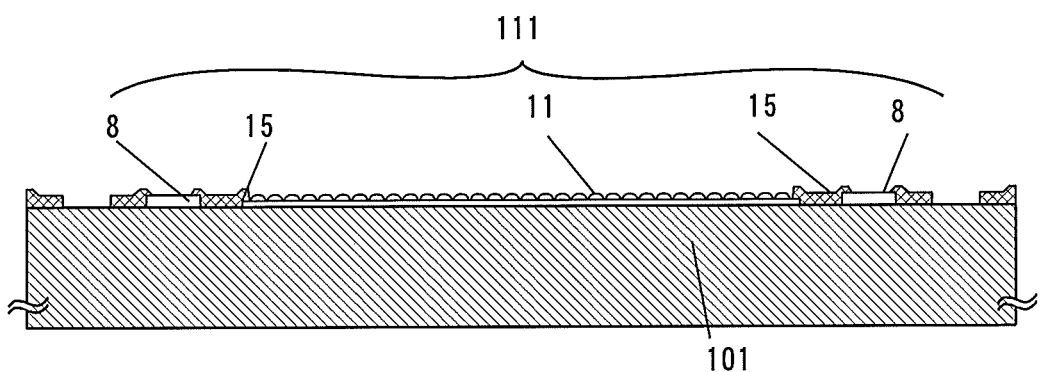
FIG. 3 is a schematic partially enlarged sectional view of the semiconductor wafer illustrating a processing process according to a first embodiment of the present invention.

FIG. 2 is a schematic plan view illustrating a semiconductor wafer 101. As shown in FIG. 2, a plurality of sensor units 111, i.e., an array of sensor units 111, is formed on the surface of the semiconductor wafer 101 having a size of 6 inches or 8 inches in a matrix pattern by a semiconductor process. FIG. 3 is a schematic partially enlarged sectional view illustrating one of the sensor units of the semiconductor wafer 101, which will constitute a camera module.

First, as shown in FIG. 3, a light receiving unit 11 including photoelectric conversion elements is formed on a first main surface of the semiconductor wafer 101 corresponding to each sensor unit 111, and a metal pad 8 is formed at the circumference of the semiconductor wafer 101 corresponding to each sensor unit 111. A CMOS image sensor having a plurality of pixels (for example, about 300,000) arranged in a matrix pattern is formed at the light receiving unit 11. Micro lenses may be provided at the respective light receiving elements of the light receiving unit 11. A transistor including a plurality of CMOS transistors is provided at each light receiving element (a buried type photo diode) of each pixel. The metal pad 8 is made of metal, such as aluminum (Al), exhibiting high conductivity.

Subsequently, an inner wire 15 is formed such that the light receiving unit 11 including the light receiving elements is connected to the meal pad 8 through the inner wire 15. As shown in FIG. 2, therefore, a plurality of sensor units 111 are arranged on the first main surface of the semiconductor wafer 101 in a matrix pattern such that a lattice type space, which will become a dicing region in a post process, is provided between the sensor unit 111.

Glass Wafer Manufacturing Process

Figure 4:
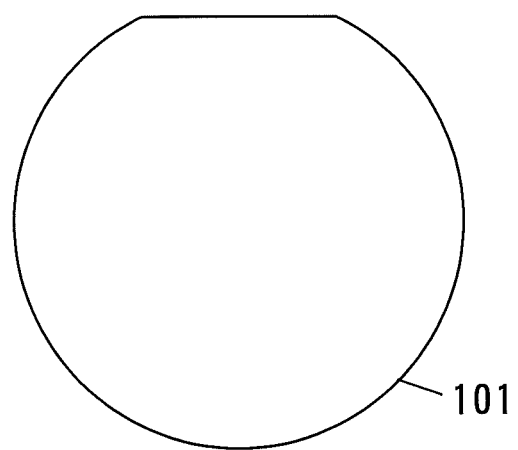
FIG. 4 is a schematic plan view illustrating a glass wafer according to a first embodiment of the present invention.

There is prepared a glass wafer (glass plate 4) having the same size as the semiconductor wafer, i.e., a size of 6 inches or 8 inches, and a thickness of 300 to 500 μm. FIG. 4 is a schematic plan view illustrating such a glass wafer 4. In the following process, a glass wafer is manufactured in which an array of plural lens units are formed at the glass wafer such that the array of plural lens units coincide with the array of sensor units, arranged in the matrix pattern, of the semiconductor wafer, and, in addition, an IR cut filter is attached to the glass wafer.

Figure 5:
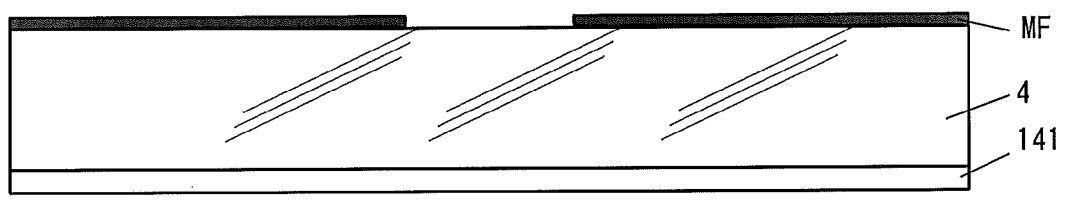
FIG. 5 is a schematic partially enlarged sectional view of the glass wafer illustrating a film forming process according to a first embodiment of the present invention.

FIG. 5 is a schematic partially enlarged sectional view of the glass wafer 4, which will become a lens chip of a camera module. First, an IR cut filter 141 is formed over the entirety of the glass wafer 4, a chrome film is deposited on the reverse side surface of the glass wafer 4, and a light shieldable mask film MF to determine a lens aperture by lithography. The IR cut filter 141 is formed of a dielectric multi-layered film. The IR cut filter 141 is constructed in a structure in which an inorganic material film exhibiting high index of refraction and an inorganic material film exhibiting a low index of refraction are alternately stacked.

Figure 7:
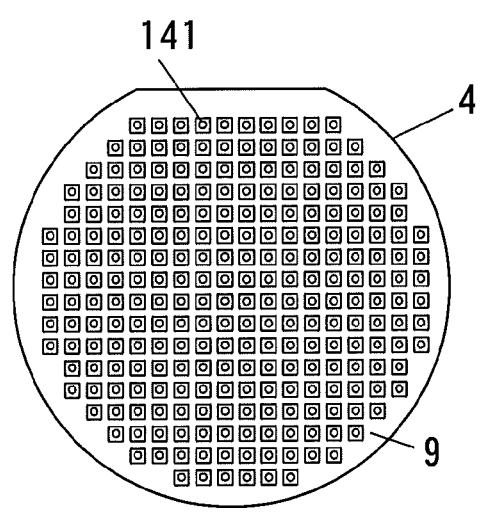
FIG. 7 is a schematic plan view of the glass wafer illustrating the lens unit forming process according to the first embodiment of the present invention.
Figure 6:
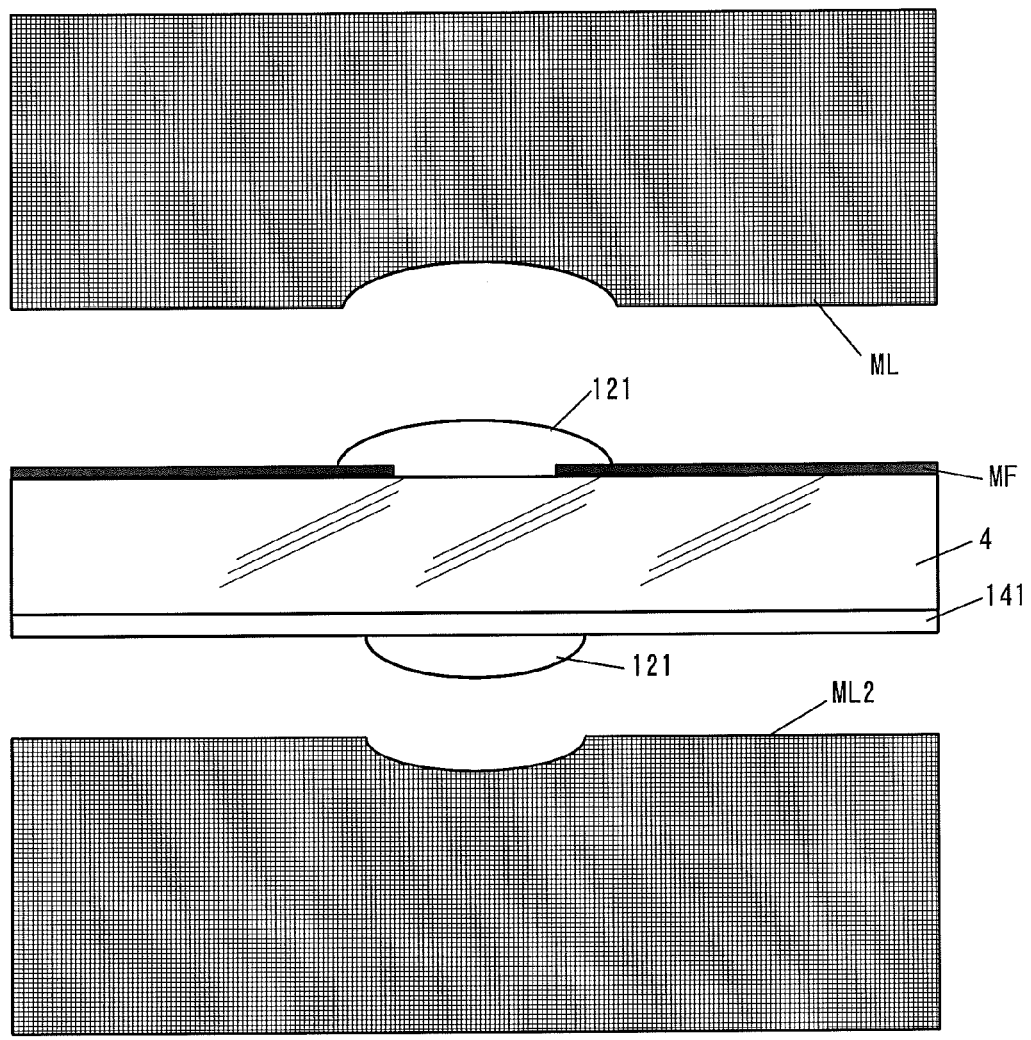
FIG. 6 is a schematic partially enlarged sectional view of the glass wafer and a mold illustrating a lens unit forming process according to a first embodiment of the present invention.

Subsequently, as shown in FIG. 6, a light transmissible resin for a lens is applied to the reverse side surface of the glass wafer 4 where the light shieldable mask film MF is formed, and a lens unit 121 is formed on the glass wafer 4 corresponding to the mask opening of the light shieldable mask film MF using a mold ML for lens formation. FIG. 7 is a schematic plan view of the glass wafer 4 when viewed from the outside of the glass wafer 4. The light transmissible resin may be of an ultraviolet curable type or a heat curable type. Also, the lens unit 121 may be formed at one side surface of the glass wafer 4 or opposite side surfaces of the glass wafer 4. For example, as shown in FIG. 6, a lens resin may be applied to the IR cut filter 141 opposite to the lens unit 121 corresponding to the mask opening, and an additional lens unit 121 may be formed using a mold ML2 for lens formation. In this lens forming process, it is possible to form a lens unit having higher power by duplicatively applying two kinds of resins to the same position twice or more using at least two kinds of molds instead of applying a resin to a position once using a mold. The mold may be one used in nano-imprint technology. For example, in a case in which the lens unit has a two-layered structure, it is preferable for a resin, such as polymethylsiloxane, which is relatively flexible and thus less affected by shrinkage to be used for the first layer on the glass plate side, and for a resin, such as epoxy, having a higher hardness than the first layer to be used for the second layer because heat resistance during reflow is improved in this structure. In the multi-layered structure, it is possible to select from a wide variety of appropriate resin materials so as to compensate for different coefficients of thermal expansion or offset warpage after light curing or heat curing.

Adhesion Process

Figure 8:
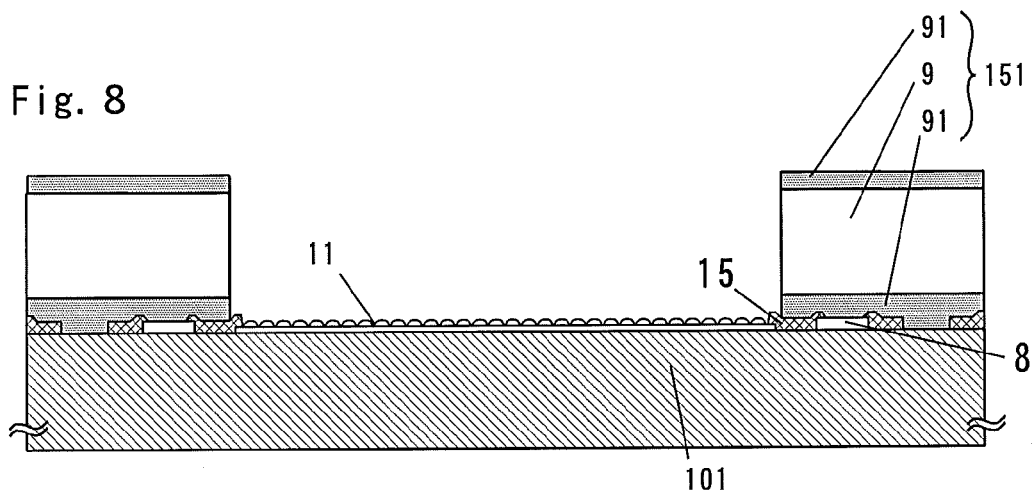
FIG. 8 is a schematic partially enlarged sectional view of the semiconductor wafer illustrating a spacer forming process according to a first embodiment of the present invention.
Figure 9:
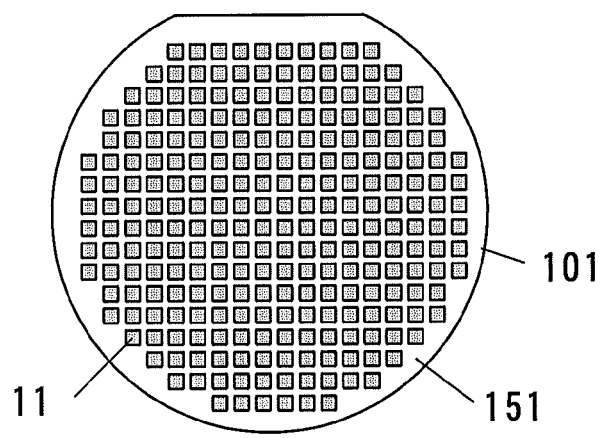
FIG. 9 is a schematic plan view of the semiconductor wafer illustrating the spacer forming process according to the first embodiment of the present invention.

Subsequently, as shown in FIG. 8, a spacer unit 151 for fixing a lens focus is bonded to the semi conductor wafer 101 having the sensor unit 111 by an adhesive. The spacer unit 151 is disposed at a predetermined position surrounding the light receiving unit 11 of the sensor unit on the first main surface of the semiconductor wafer as a dicing region. The spacer unit 151 includes a spacer 9 having a predetermined thickness to prescribe a flange back and adhesive material layers 91 disposed at opposite main surfaces of the spacer 9. A material having high heat resistance, for example, a photosensitive polymer material, such as benzocyclobutene (BCB) and polyimide may be used as the adhesive material. Also, an ultraviolet curable type or a heat curable type adhesive material may be used. As shown in FIG. 9, the light receiving units 11 surrounded by the lattice type spacer unit 151 on the dicing region of the semiconductor wafer correspond respectively to the lens units of the glass wafer.

Figure 10:
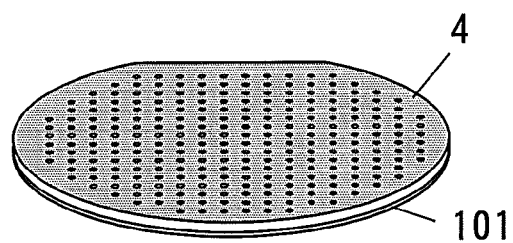
FIG. 10 is a schematic perspective view of a wafer assembly of a light transmissible optical wafer and the semiconductor wafer bonded to each other illustrating an adhesion process according to a first embodiment of the present invention.
Figure 1:
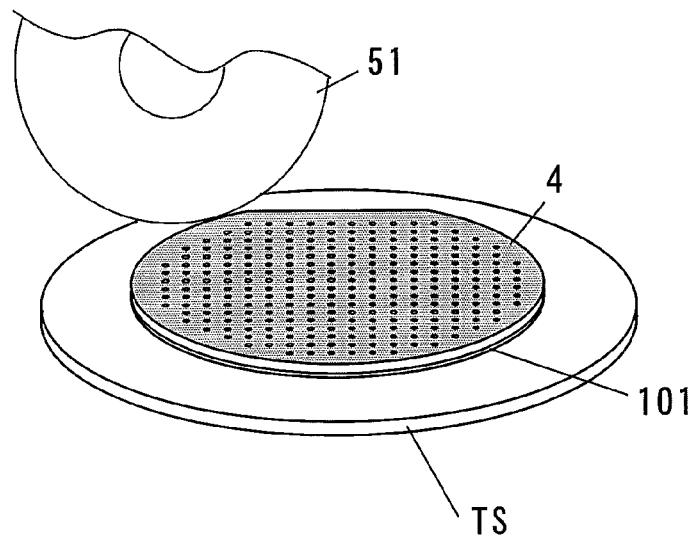
Figure 1:
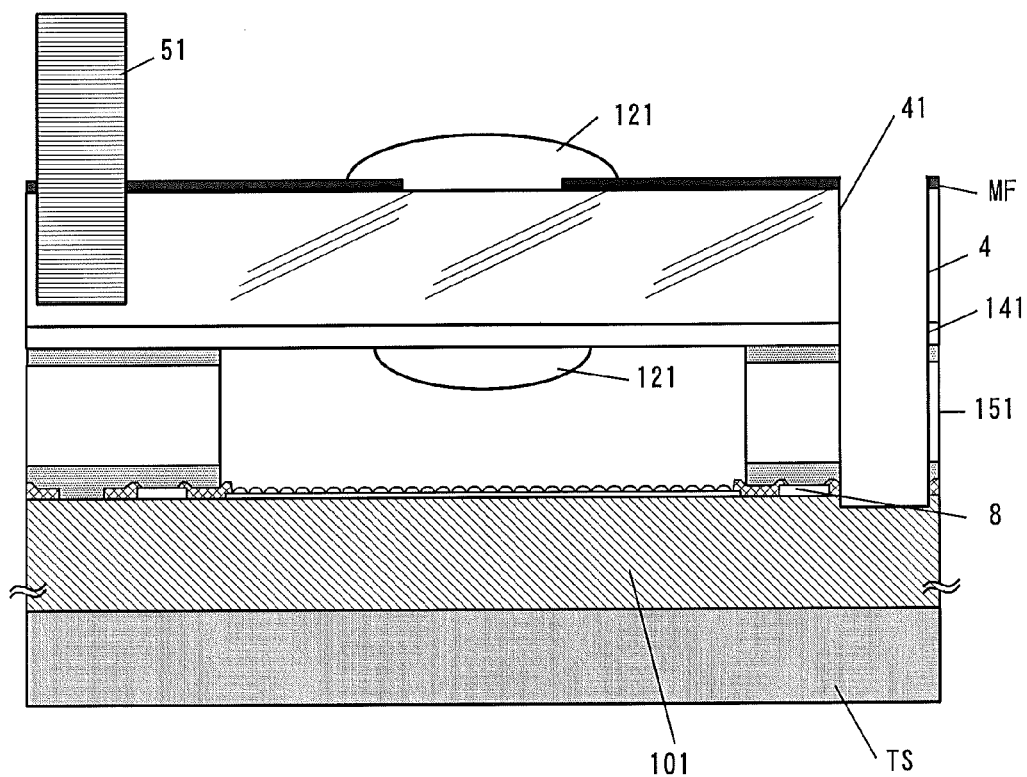
Figure 19:
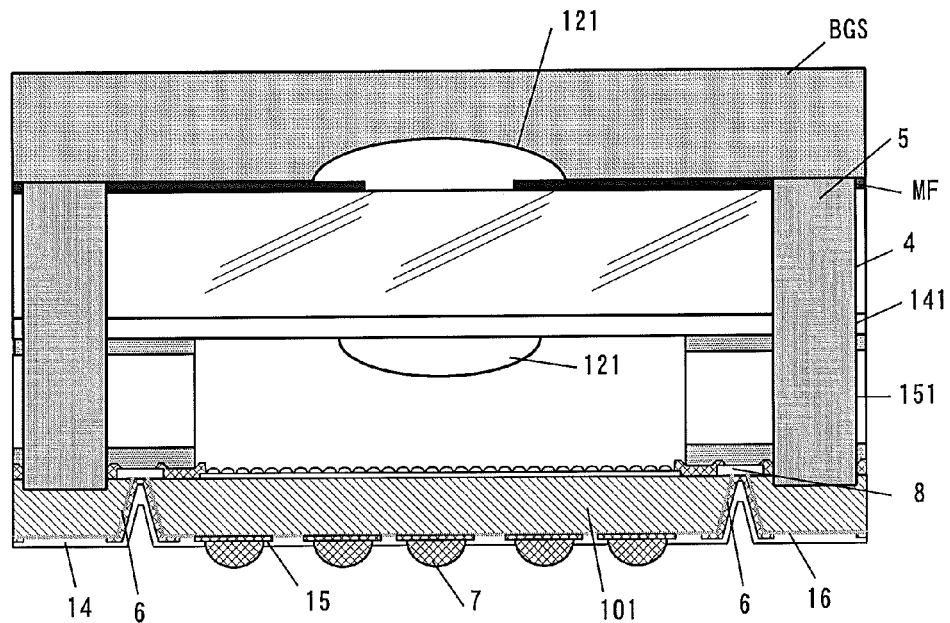

Subsequently, as shown in FIG. 19, the semiconductor wafer 101 and the glass wafer 4 are fixedly bonded to each other while the lens units 121 are aligned with the sensor units 111. At this time, the glass wafer 4 and the semiconductor wafer 101 are positioned such that the light receiving units 11 on the semiconductor wafer 101 are surrounded by the lattice type spacer unit 151 formed on the reverse side surface of the glass wafer 4. FIG. 10 is a schematic perspective view of a wafer assembly of the semiconductor wafer 101 and the glass wafer 4 bonded to each other. In a case in which a photosensitive adhesive is used, light irradiation may be performed from the glass wafer side, and the adhesion may be performed by light curing of the spacer unit 151. The spacer unit 151 serves to maintain a predetermined distance between the semiconductor wafer 101 and the glass wafer 4 when the semiconductor wafer 101 and the glass wafer 4 are bonded to each other and, in addition, to encapsulate the respective sensor units 111 in subsequent processes, such as a grinding process, a via electrode forming process, and dicing process.

Light Shieldable Resin Layer Forming Process

As shown in FIGS. 11 and 12, a glass wafer 4 is cut into a predetermined size by a blade dicing method using a first dicing blade 51 to form a groove 41 in a dicing region. First, as shown in FIG. 11, the wafer assembly of the semiconductor wafer 101 and the glass wafer 4 bonded to each other is disposed on a support table TS of a dicing device such that the surface of the wafer assembly is processed by the blade. The cutting width (the blade thickness) is preferably 60 to 100 μm because additional cutting may be necessary in the following process. As shown in FIG. 12, half cutting is performed using the first dicing blade 51 such that the glass wafer 4 is cut from on the side of the glass wafer 4 until the first dicing blade 51 reaches the semiconductor wafer 101. Meanwhile, groove formation (half cutting) may be achieved by a laser method using no dicing blade.

Figure 13:
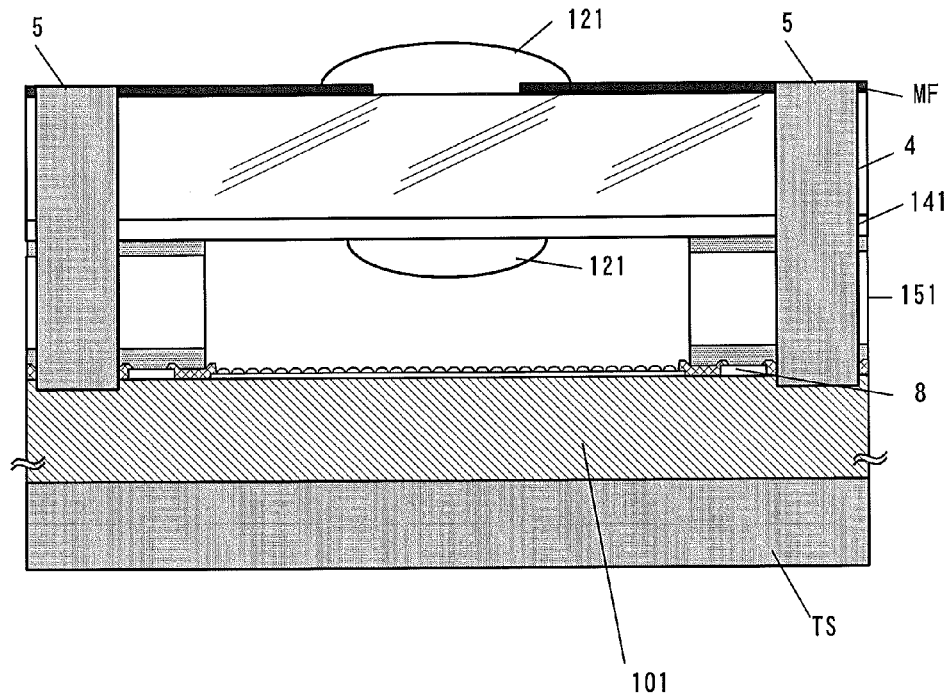

Subsequently, as shown in FIG. 13, the cut groove portion is filled with a light shielding resin by a printing method or a dispensing method to form a light shielding resin layer 5. The light shielding resin layer 5 may be formed of a mixture of a polymer resin, such as an epoxy resin, and a pigment, such as carbon black or triiron tetraoxide. Also, dark pigments exhibiting high light shieldability may be used in addition to the black pigment.

Grinding Process

The reverse side surface of the semiconductor wafer 101 integrated with the glass wafer 4 taken out from the dicing device is rendered thin through a grinding or polishing process.

Figure 14:
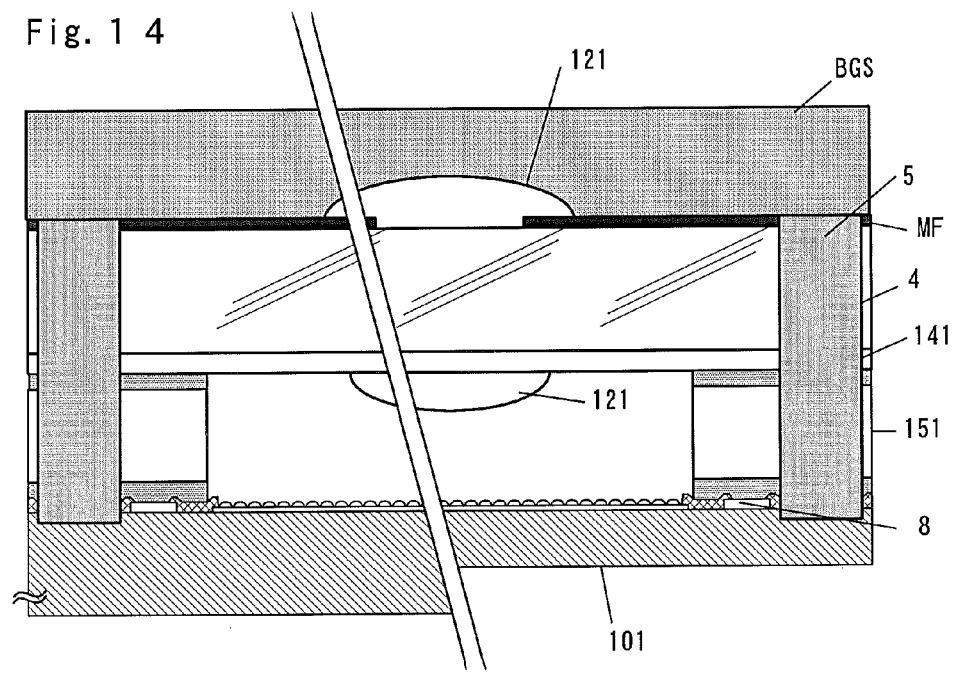

First, the lens unit 121 on the side of the glass wafer 4 is bonded to a sheet BGS for back grinding. Subsequently, as shown in FIG. 14, the wafer having a thickness of, for example, 600 to 700 μm is ground to a predetermined thickness of 50 to 100 μm by back grinding to reduce the thickness of the wafer. The sheet BGS preferably has high viscoelasticity so as to protect the lens unit 121 and, in addition, to maintain adhesion stability between the sheet BGS for back grinding and the lens unit 121 in the back grinding process and in the following process.

Electrode Forming Process

Via electrodes, outer wires, and external terminals are formed at the second main surface of the semiconductor wafer 101 integrated with the glass wafer 4. Briefly, through holes are formed by etching, and wires are drawn out by copper (Cu) plating to form electrode pads.

Figure 15:
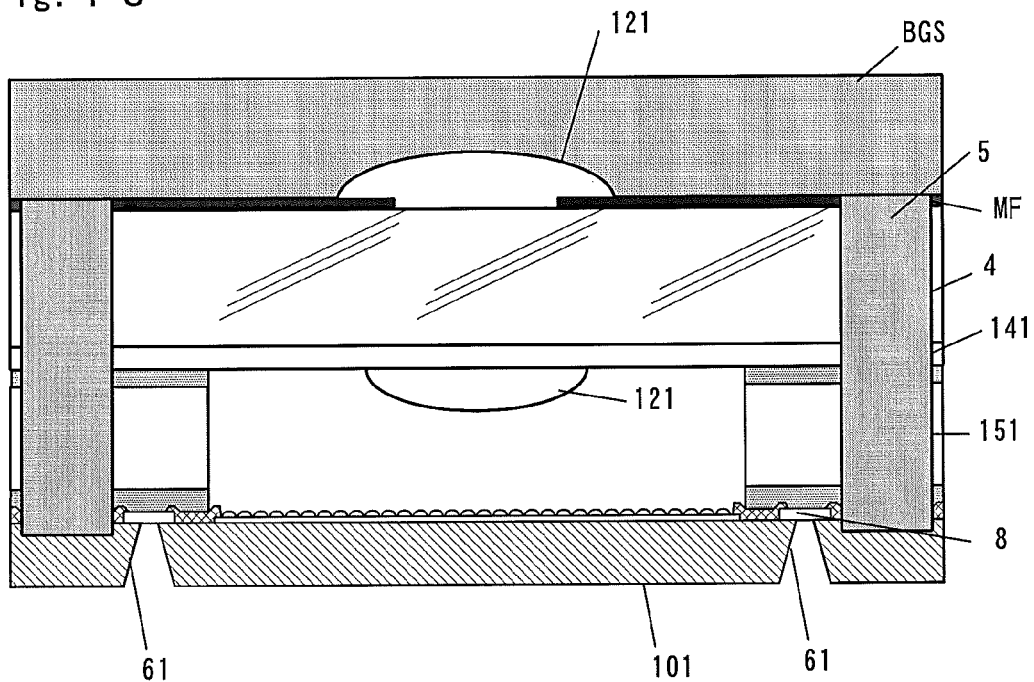

First, as shown in FIG. 15, through holes 61 (diameter=100 to 200 μm) are formed from the reverse side surface (the second main surface) of the semiconductor wafer 101 to the respective metal pads 8. The through holes 61, each having a size slightly less than that of each of the metal pads 8, are formed at positions corresponding to the respective metal pads 8 of the semiconductor wafer 101 through the reverse side surface of the semiconductor wafer 101 by reactive ion etching. In the reactive ion etching, metal or resist mask (not shown) having an opening corresponding to a region where the through holes 61 are to be formed is previously formed at the second main surface of the semiconductor wafer 101, and, afterwards, the Si wafer is etched through the opening, for example, by $SiF_4$ formation reaction in an atmosphere of mixed gas, such as $CF_4$, to form the through holes 61.

Figure 16:
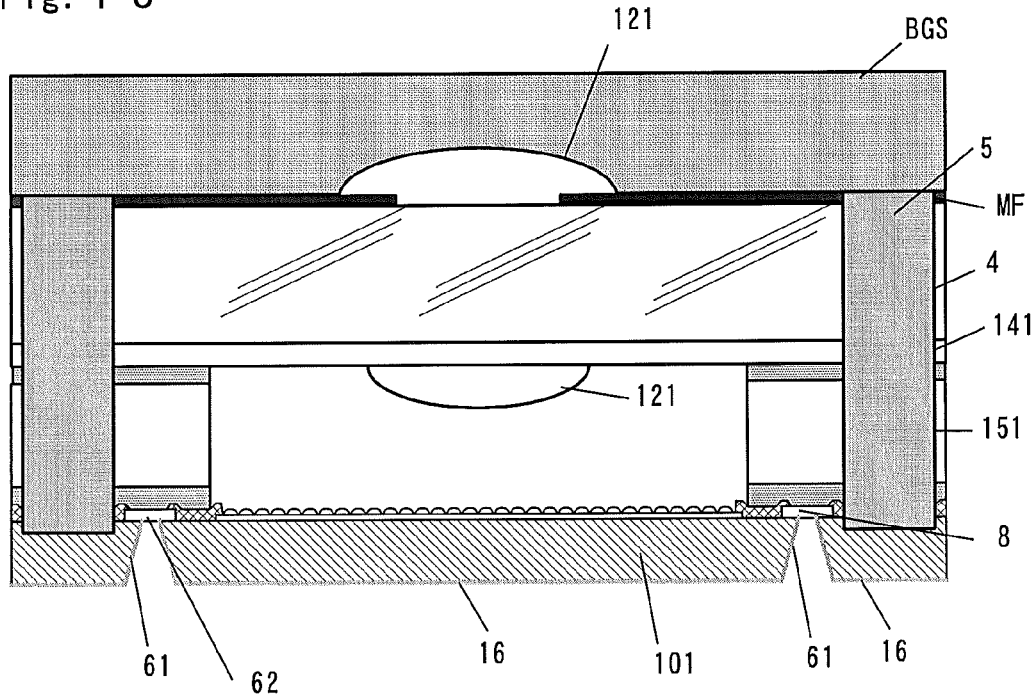

Subsequently, as shown in FIG. 16, an insulation film made of, for example, $SiO_2$ is formed on the inner walls and bottoms (the metal pads 8) of the through holes 61 and the second main surface of the semiconductor wafer 101, for example, by chemical vapor deposition (CVD). The insulation film 16 is formed such that the thickness of the insulation film 16 on the bottoms (the metal pads 8) of the through holes 61 is less than the thickness of the insulation film 16 on the second main surface of the semiconductor wafer 101. As a result, openings 62 of the insulation film 16 are formed at the bottoms of the through holes 61 by additional reactive ion etching, with the result that the metal pads 8 are exposed; however, the insulation film 16 on the inner walls of the through holes 61 and the second main surface of the semiconductor wafer 101 are maintained.

Figure 17:
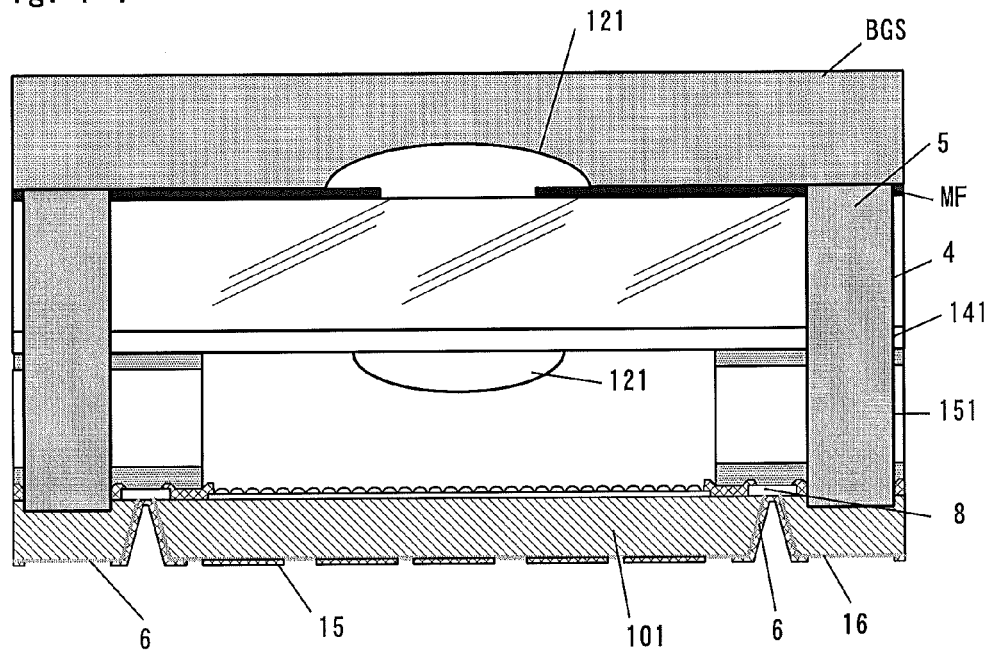

Subsequently, a mask (not shown) of a predetermined pattern having openings corresponding to the through holes where the metal pads 8 are exposed, regions around the through holes where the via electrodes are to be formed, and regions where outer wires, which will be connected to the via electrodes, are to be formed, is previously formed on the insulation film 16 at the second main surface of the semiconductor wafer 101, and, as shown in FIG. 17, outer wires 15 and via electrodes 6 are formed by electroplating.

Figure 18:
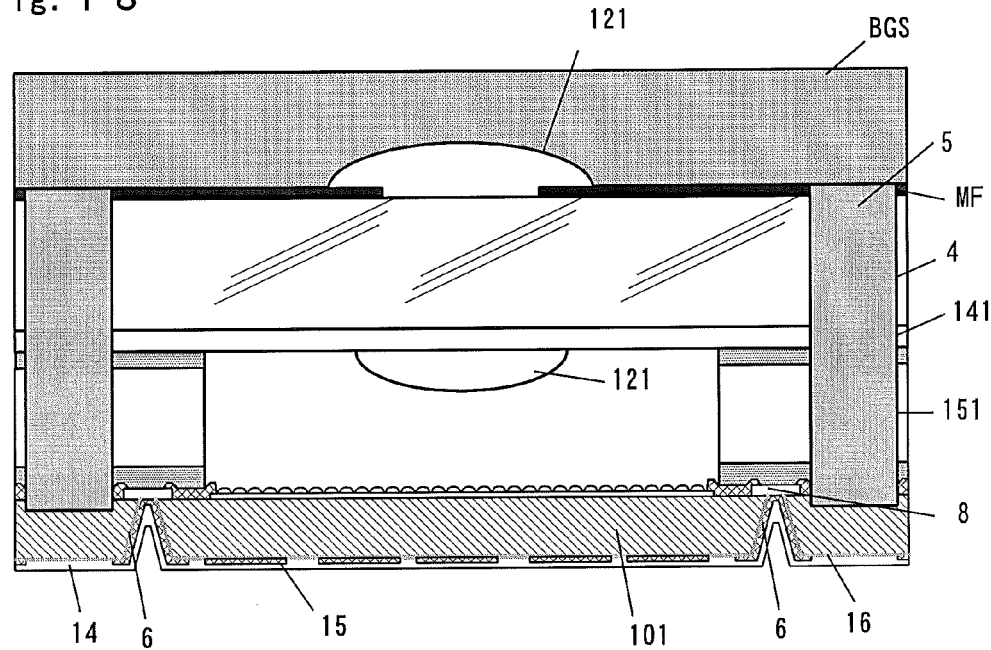

Subsequently, as shown in FIG. 18, an insulation film 14 is applied over the entirety of the reverse side surface of the semiconductor wafer 101, and patterning using lithography is performed such that electrodes are exposed from regions where external terminals 7 for connection with an external circuit are to be formed. After that, solder paste is applied and reflowed on the exposed electrodes of the reverse side surface of the semiconductor wafer 101 by screen printing. After that, residual flux is removed, and, as shown in FIG. 19, external terminals 7 are formed. Meanwhile, a metal seed film (not shown) may be formed before the external terminals 7 are formed.

Also, the insulation film 15 may be formed of SiN or polyimide (PI) in addition to $SiO_2$. Also, the wires may be formed of one or more conductive materials selected from a group consisting of Cu, Al, Ag, Ni, and Au. The external terminals 7 may be formed of SnAg or NiAu.

Dicing Process

Figure 20:
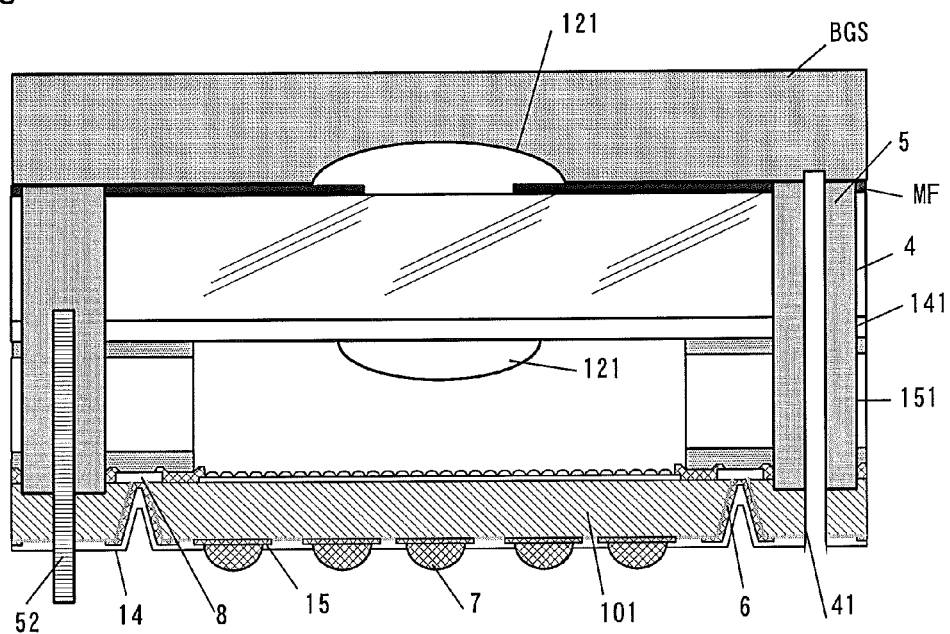

First, as shown in FIG. 20, the wafer assembly of the semiconductor wafer 101 and the glass wafer 4, to which the sheet BGS for back grinding is attached, is disposed on a support table (not shown) of a dicing device such that the side surface of the semiconductor wafer 101 is processed by the blade.

As shown in FIG. 20, the semiconductor wafer 101 integrated with the glass wafer 4 is cut from the glass wafer 4 to the sheet BGS along the middle of the dicing region (the spacer unit 151) of the light shieldable resin layer 5 in the thickness direction by a second dicing blade 52 (thinner than the blade for grove formation) such that the semiconductor wafer 101 integrated with the glass wafer 4 is divided into a plurality of camera modules. In this process, the second dicing blade is set so as to perform full cut with a width less than the width of the groove half cut in the previous light shieldable resin layer forming process and, in addition, such that the light shieldable resin layer 5 remains at the side surface of the glass wafer 4.

Figure 21:
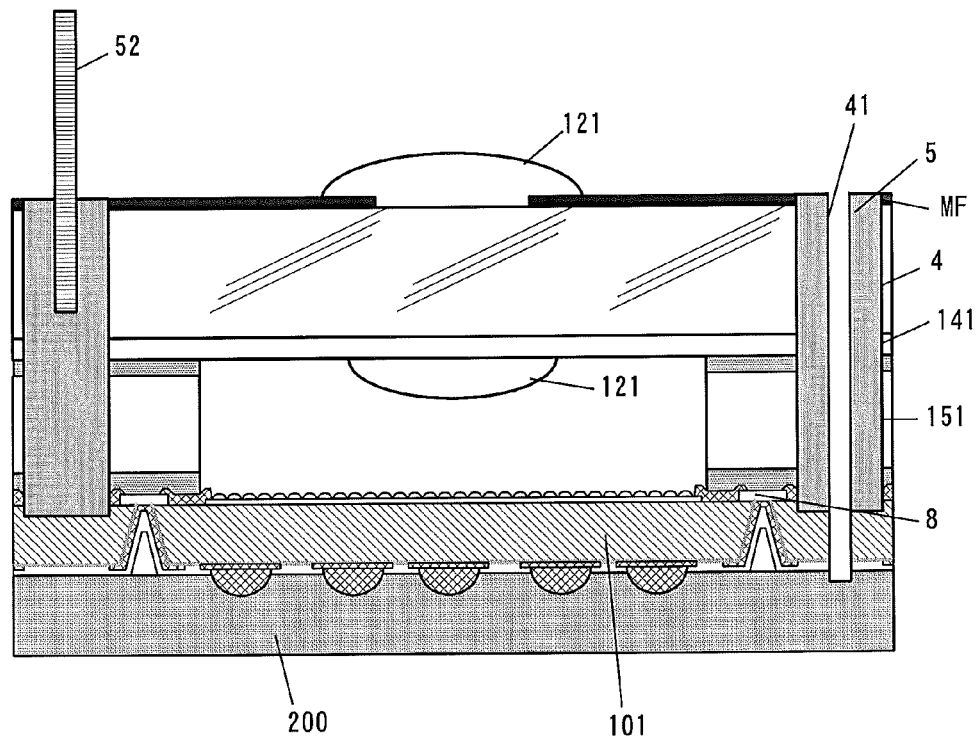
FIG. 21 is a partial sectional view of a wafer assembly of a camera wafer and a semiconductor wafer bonded to each other illustrating another example of the camera module manufacturing process according to the first embodiment of the present invention.

Meanwhile, as shown in FIG. 21, the sheet BGS for back grinding may be separated from the glass wafer 4, a dicing device may be mounted by bonding a dicing table 200 to the glass wafer 4 on the side of the wafer assembly of the glass wafer 4 and the semiconductor wafer 101 bonded to each other, and dicing may be performed from the semiconductor wafer 101 side.

As described above, the glass wafer 4 and the semiconductor wafer 101 are fully cut into a predetermined size, thereby obtaining the camera module including the lens chip 40, the spacer unit 151, and the sensor chip 10, as shown in FIG. 1.

As described above, the glass wafer 4 and the semiconductor wafer 101 are fully cut into a predetermined size, thereby obtaining the camera module including the glass wafer 4 from the side of which the introduction of light is prevented by the light shieldable resin layer 5, the spacer unit 151, and the semiconductor chip 10, as shown in FIG. 1. Meanwhile, according to circumstances, at least two sides of the glass wafer 4 are formed so as to be smaller than the semiconductor chip 10, and all the sides of the glass wafer 4 are not limited to be covered by the light shieldable resin layer. Also, when the glass wafer 4 is set to a predetermined size such that the light shieldable resin layer 5 remains at the side of the glass wafer 4 after cutting, it is possible to fully cut the glass wafer 4 and the semiconductor wafer 101 by a laser in addition to the blade dicing.

According to the embodiment as described above, it is possible to restrain the introduction of light from the side of the glass wafer 4 by the light shieldable resin layer 5 and to improve properties of the camera module. Also, it is possible to reduce the scribe line width of the semiconductor chip even when the width of the light shieldable resin layer is large, and therefore, it is possible to increase an effective number of chips on the wafer, thereby improving a yield ratio and reducing costs. Also, since the wide light shieldable resin layer is narrowly cut according to the scribe line width of the semiconductor chip 10 to simultaneously form the large wide light shieldable resin layer per camera module, it is possible to reduce the number of processes. Furthermore, since the resin layer is formed at the side of the brittle glass, it is possible to prevent the occurrence of defects or breakage of the glass, thereby achieving easy handling. In addition, since the light shieldable resin layer 5, which is colored black, is disposed at the side of the glass wafer 4, it is not necessary to provide an additional guide cover for light shielding, thereby reducing costs.

The above-described method may be applied to various kinds of camera modules including a picture sensor circuit, such as a CCD sensor circuit, a luminance sensor circuit, an ultraviolet sensor circuit, an infrared sensor circuit, and a temperature sensor circuit in addition to the CMOS sensor in the sensor circuit.

Consequently, it is possible to manufacture a camera module including a light shielding film from a wafer in a batch process without performing a process of individually fixing light shielding covers as in the conventional art.

OTHER EMBODIMENT

A camera module according to a second embodiment is identical to the camera module according to the first embodiment except that the material for a spacer unit is changed from glass to silicon, a groove is formed up to the middle of the thickness of the spacer unit in a groove forming process.

A camera module manufacturing method according to a second embodiment is identical to the camera module manufacturing method according to the first embodiment in processes including up to the process of manufacturing the wafer assembly of the glass wafer 4 and the semiconductor wafer 101 bonded to each other, as shown in FIG. 12, before the light shieldable resin layer forming process.

Figure 22:
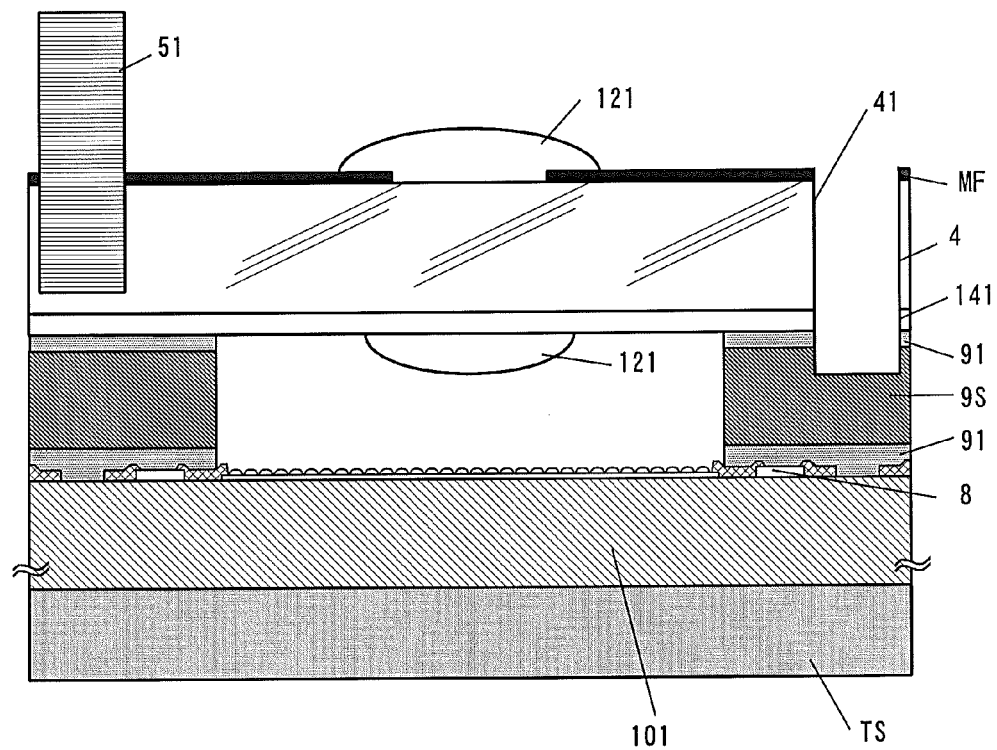
FIGS. 22 and 23 are partial sectional views of a wafer assembly of a camera wafer and a semiconductor wafer bonded to each other illustrating a camera module manufacturing process according to a second embodiment of the present invention.

In the light shieldable resin layer forming process, as shown in FIG. 22, a dicing device is mounted by bonding a dicing table 200 to the entire surface on the wafer on the side of the wafer assembly of the glass wafer 4 and the semiconductor wafer 101 bonded to each other, and dicing is performed. In this embodiment, a spacer unit includes a spacer 9S made of silicon and adhesive material layers 91 disposed at opposite main surfaces of the spacer 9S. An ultraviolet et curable type or a heat curable type adhesive material may be used.

Since the silicon, which the spacer is made of, shields visible light, a groove 41 is formed more shallowly than in the first embodiment by dicing up to the interface of the spacer 9S, a resin (not shown) for light shielding, which is colored black or the like, is applied and filled, and the resin is cured using light or heat, to form a light shieldable resin layer.

Subsequently, the lens substrate is bonded to a sheet for back dicing, and the sensor substrate is diced up to a predetermined thickness. Via holes are formed by etching, and wires are drawn out by copper (Cu) plating to form electrode pads. Solder bumps are formed, and individual cutting is performed by dicing, thereby obtaining an individual camera module.

Figure 23:
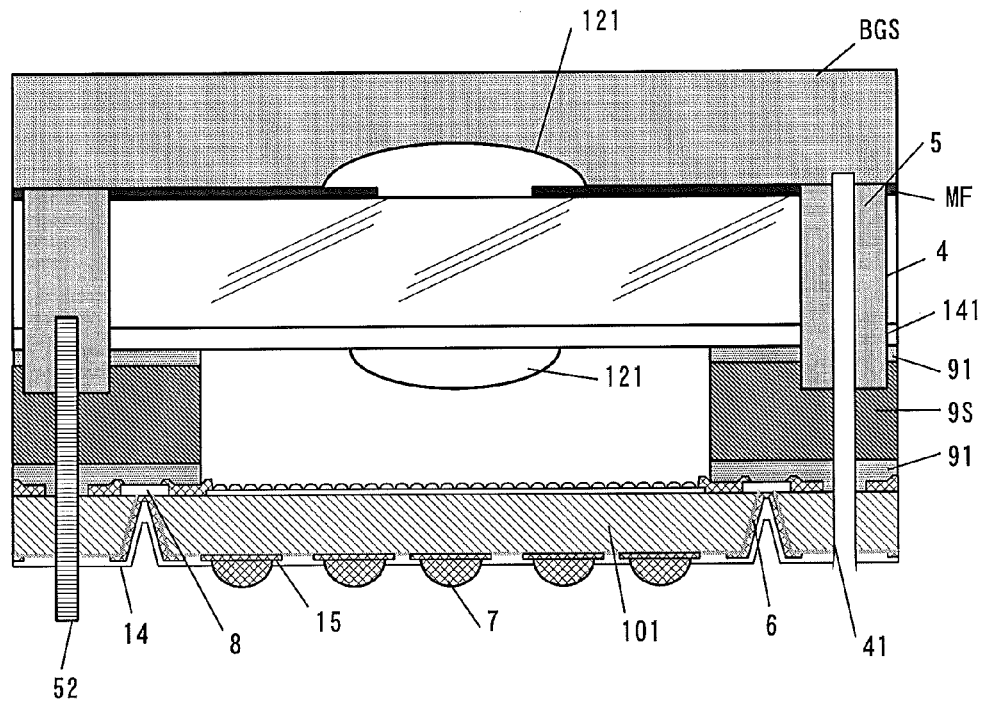

Subsequently, as shown in FIG. 23, the glass wafer 4 and the semiconductor wafer 101 integrated with each other by the light shielding resin layer 5 are cut into individual camera module along the middle of the light shieldable resin layer 5 in the thickness direction by a predetermined second dicing blade 52, in the same manner as in the dicing process according to the first embodiment.

Figure 24:
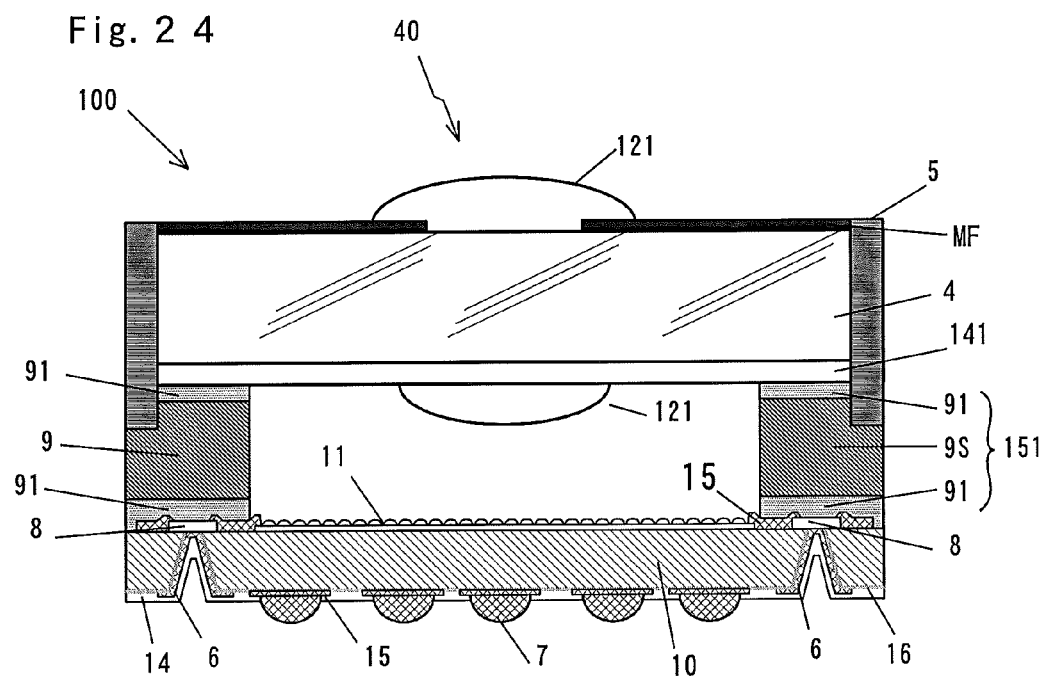
FIG. 24 is a sectional view illustrating a camera module according to a second embodiment of the present invention.

As described above, the glass wafer 4 and the semiconductor wafer 101 are fully cut into a predetermined size, thereby obtaining the camera module including the glass wafer 4 from the side of which the introduction of light is prevented by the light shieldable resin layer 5, the spacer unit 151, and the semiconductor chip 10, as shown in FIG. 24.

It is possible to manufacture a camera module including a light shielding film from a wafer in a batch process without performing a process of individually fixing light shielding covers, thereby reducing the amount of a resin for light shielding applied and more efficiently manufacturing a camera module.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2008-288882 which is hereby incorporated by reference herein.

What is claimed is:

1. A camera module comprising:
a sensor chip including a sensor unit formed on a main surface of the sensor chip;
a first side of the sensor chip disposed around the main surface;
a second side of the sensor chip adjacent to and offset from the first side;
a lens chip which is fixed to the sensor chip with a spacer unit and includes a lens unit corresponding to the sensor unit;
a light shieldable layer covering the first side of the sensor chip and a side of the spacer unit; and
a first cutting surface including the second side of the sensor chip and a side of the light shieldable layer on a same plane.

2. The camera module according to claim 1, further comprising a second cutting surface including the first side of the sensor chip and the side of the spacer unit on a same plane.

3. The camera module according to claim 1, further comprising a second cutting surface including the first side of the sensor chip, the side of the spacer unit and a side of the lens chip on a same plane, the light shieldable layer covering at least one part of the side of the lens chip.

4. The camera module according to claim 1, wherein the lens chip includes a light shieldable mask film to determine a lens aperture of the lens unit by partially covering a main surface of the lens unit.

5. The camera module according to claim 1, wherein the spacer unit is formed of glass.

6. The camera module according to claim 1, wherein the spacer unit is formed of silicon.

7. The camera module according to claim 1, wherein the camera module includes a via electrode electrically connected to the sensor unit and extending through the sensor chip so as to be exposed.

8. The camera module according to claim 1, wherein the camera module includes a filter formed at the lens chip for transmitting only light of a predetermined wavelength band.

9. The camera module according to claim 1, wherein the lens chip comprises a glass plate and a lens unit bonded to a main surface of the glass plate, and the lens unit is formed of a resin.

10. The camera module according to claim 9, wherein the lens chip includes a light shieldable mask film to determine a lens aperture of the lens unit, a portion around the lens aperture of the light shieldable mask film is partly disposed between the main surface of the glass plate and the lens unit.

11. The camera module according to claim 1, wherein the second side of the sensor chip is disposed around the main surface.

* * * * *